United States Patent [19]

Gloanec

[11] Patent Number: 4,975,661
[45] Date of Patent: Dec. 4, 1990

[54] GUNN TRIODE DEVICE, FREQUENCY DIVIDER AND OSCILLATOR USING THIS GUNN DEVICE

[75] Inventor: Maurice Gloanec, Bures sur Yvette, France

[73] Assignee: Thomson Hydbrides et Microondes, Paris, France

[21] Appl. No.: 228,168

[22] Filed: Aug. 4, 1988

[30] Foreign Application Priority Data

Aug. 5, 1987 [FR] France ............................ 87 11143

[51] Int. Cl.$^5$ .......................................... H03B 7/00
[52] U.S. Cl. .................................. 331/107 G; 357/3
[58] Field of Search ..................... 331/107 G; 357/3

[56] References Cited

U.S. PATENT DOCUMENTS

| | | | |
|---|---|---|---|
| 3,538,400 | 11/1970 | Yanai et al. ............................ | 357/3 |
| 4,023,196 | 5/1977 | Kataoka et al. ....................... | 357/57 |
| 4,086,501 | 4/1978 | Upadhyayula ................. | 331/107 G |

OTHER PUBLICATIONS

Proceedings Fifth Biennial Cornell Electrical Engineering Conference, 1975, Ithaca, N.Y., Aug. 19-21, pp. 195-203.

*Primary Examiner*—Robert J. Pascal
*Attorney, Agent, or Firm*—Oblon, Spivak, McClelland, Maier & Neustadt

[57] ABSTRACT

A Gunn effect triode working as a programmable frequency dynamic divider or as a VCO oscillator is disclosed. The Gunn effect triode is made up of a layer of III-V material and has three metallizations, namely the anode metallization, the cathode metallization and the gate metallization. According to the invention, firstly, the layer has a non-uniform width between the anode and gate metallization which is either trapezoidal or bounded by two hyperbolas. Then, on the gate metallization DC bias voltage, $V_{GK}$, or the anode metallization DC bias voltage, $V_{AK}$, there is superimposed an alternating control voltage, $V_{HF}$, which is a harmonic of the free oscillating frequency of the triode. The order of division is equal to the harmonic order. The output frequency is adjusted by vernier operation on the harmonic frequency.

13 Claims, 2 Drawing Sheets

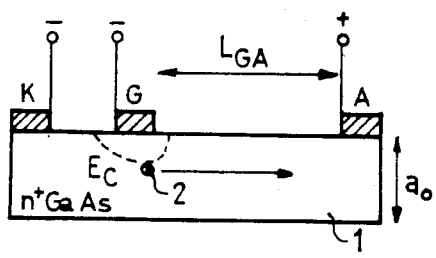
FIG_1 PRIOR ART
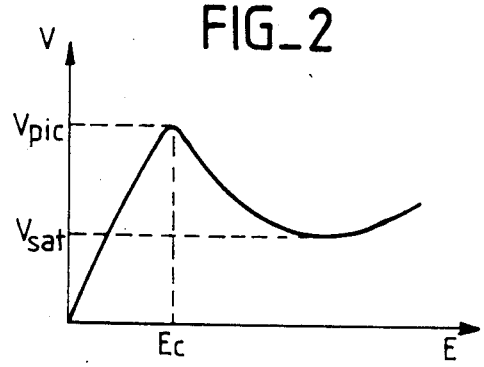
FIG_2
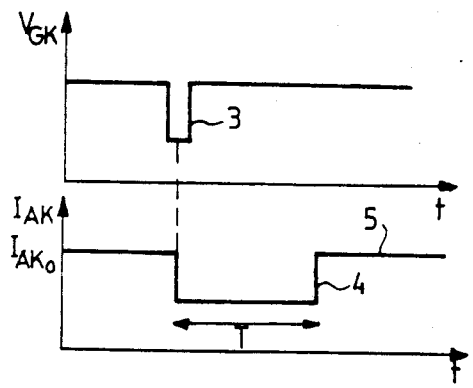
FIG_3
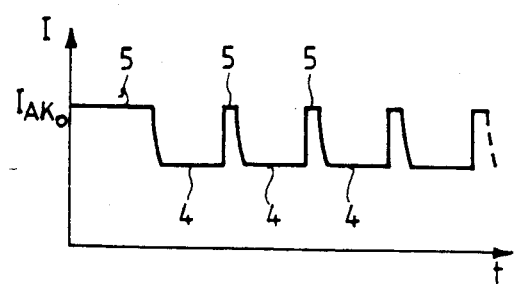
FIG_4
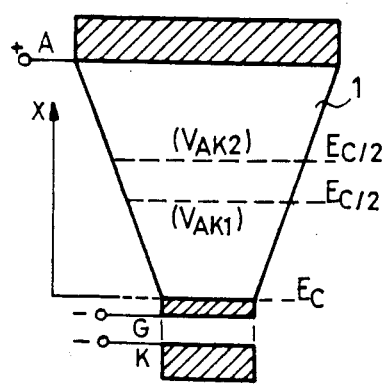
FIG_5 PRIOR ART
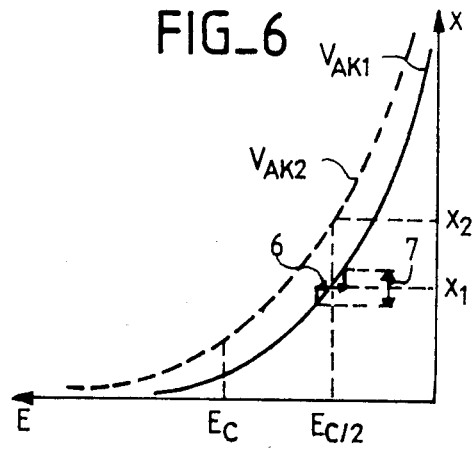
FIG_6

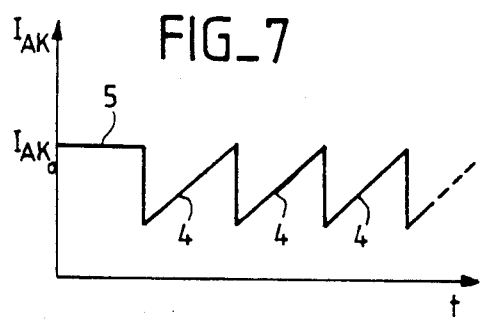
FIG_7
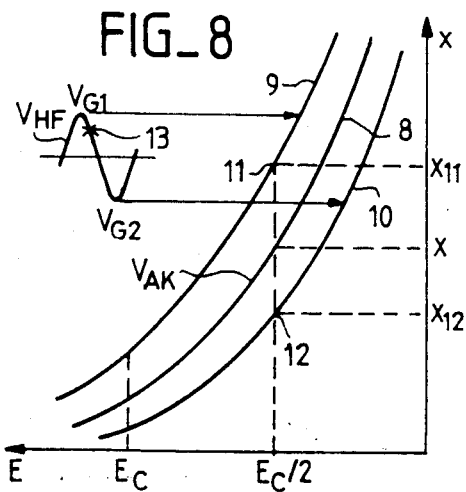
FIG_8
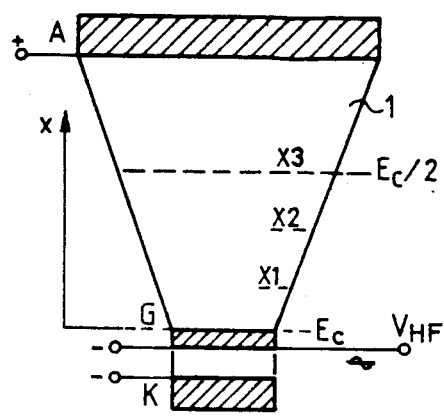
FIG_9
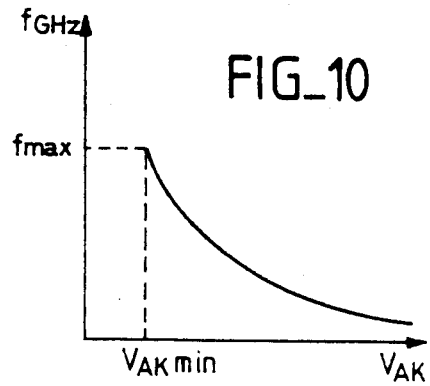
FIG_10
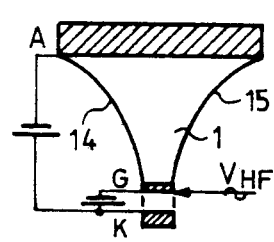
FIG_11
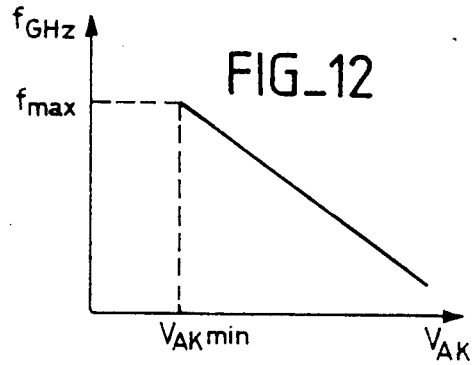
FIG_12
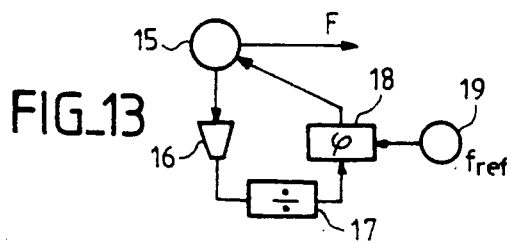
FIG_13

GUNN TRIODE DEVICE, FREQUENCY DIVIDER AND OSCILLATOR USING THIS GUNN DEVICE

BACKGROUND OF THE INVENTION

1. Field of the Invention

The present invention concerns a Gunn triode device of a trapezoidal geometry, operating as a dynamic frequency divider, of a fixed and variable order, at very high frequencies of up to 60 GHz.

2. Description of the Prior Art

The phenomenon of electron transfer or the Gunn effect has been known since 1963 when J. B. Gunn discovered that in a bar of group III–V material, such as GaAs or InP, having uniform n type doping and being biased between the anode and the cathode, the current oscillates when the electrical field goes above a certain threshold: to each oscillation, there corresponds a "bunch" or domain of electrons which leaves the cathode and are transferred to the anode. The oscillation can be controlled by means of an additional electrode called a gate electrode.

This is why the main applications known to date concern oscillators with fixed or very slightly adjustable frequencies.

According to the invention, a Gunn triode device, having a layer of group III–V material, with a non-uniform section when seen in a plane view between the anode and the cathode, works as a frequency divider if an AC voltage is superimposed on a DC voltage applied to the gate or anode, the AC voltage having a frequency which is a higher order harmonic of the free oscillation frequency of the Gunn device. The term free oscillation frequency refers to the frequency at which the Gunn triode oscillates for a given DC voltage $V_{AK}$ and for a given DC voltage at the gate.

SUMMARY OF THE INVENTION

More precisely, the invention concerns a Gunn triode device working at very high frequencies (1 to 60 GHz) and comprising, supported by a substrate, a layer of group III–V semi-conducting material provided with three metallizations, namely an anode at a first end of the layer, a cathode at a second end of the layer and a gate near the cathode, the device having a free oscillation frequency when it is biased by a first DC voltage ($V_{AK}$) between the anode and the cathode and a second DC voltage ($V_{GK}$) between the gate and the cathode, the device being characterized in that:

- the layer of semi-conducting material located between the anode and gate metallizations has a non-uniform width, the anode being wider than the gate;
- the device is biased by an AC control voltage superimposed either on the first DC voltage $V_{AK}$ or on the second DC voltage $V_{GK}$, the AC voltage having a frequency which is a harmonic of the free oscillation frequency of the Gunn triode.

BRIEF DESCRIPTION OF THE DRAWINGS

The invention will be better understood from the following detailed description made with reference to the appended figures, of which:

FIG. 1 shows a sectional view of a prior art Gunn triode device;

FIG. 2 is a graph showing the speed of the charge carriers as a function of the electrical field, in the Gunn effect;

FIG. 3 is a graph showing the current of propagation of a domain, after a pulse at the gate, in the Gunn effect;

FIG. 4 is a graph showing the oscillation of a Gunn triode subjected to a DC bias, such as under the gate $E > E_c$;

FIG. 5 shows a plane view of a Gunn triode, with a trapezoidal section between the anode and the cathode, according to the prior art;

FIG. 6 is a graph showing the electrical field as a function of the distance x from the gate, in a Gunn triode with a trapezoidal section;

FIG. 7 is a graph showing the oscillation of a trapezoidal section Gunn triode subjected to a bias such that, under the gate, $E > E_c$;

FIG. 8 is a graph of the electrical field as a function of the distance x from the gate, in a Gunn triode according to the invention;

FIG. 9 shows a plane view of a Gunn triode according to the invention, explaining its operation, for a geometry of a first embodiment;

FIG. 10 shows a frequency response curve, as a function of the anode-cathode voltage, of a Gunn cathode;

FIG. 11 shows a plane view of a Gunn triode according to the invention, in a second embodiment;

FIG. 12 shows a frequency response curve, as a function of the anode-cathode voltage, of the Gunn triode of the previous figure;

FIG. 13 is a block diagram of an oscillator controlled in frequency by an automatic phase control loop making use of the invention.

DESCRIPTION OF PREFERRED EMBODIMENTS

The Gunn effect and its application to oscillators are well known, but a reminder of its working will provide a better understanding of the phenomena that come into play in the present invention. In this respect, a number of curves appended herewith are already known per se but are also applicable to the invention since it is the manner of using a Gunn triode or, more precisely, the manner of biasing it that constitutes the basis of the present invention.

As shown in FIG. 1, a Gunn effect device consists of a bar 1 of group III–V semi-conducting material, such as GaAs or InP, which is homopolar and n doped at a level of the order of $5 \times 10^{14}$ to $5 \times 10^{15}$ at/cm$^3$ [3]. For a Gunn diode, at least one anode A and one cathode K are deposited, in the form of metallizations, at the ends of the bar which generally has a rectangular geometry when seen in a plane view. For a triode, a gate metallization G is deposited on the bar 1, between the anode and the cathode, near the cathode K. A bias voltage difference is applied between the anode and the cathode.

If:

$n_o$ is the doping rate of the semi-conducting material,
$L_{GA}$ is the distance between the gate and the anode,
$a_o$ is the thickness of the bar of semi-conducting material, then, it is necessary that:

$$n_o L_{GA} > 10^{12} \text{cm}^{-2}$$

and $$n_o a_o > 10^{11} \text{cm}^{3} \text{ [2]}$$

for the device to work according to the Gunn effect.

It is also known that in a block of uniformly n doped III–V material, the mobility of the charge carriers as a function of the electrical field E has a negative variation in an interval of fields, such that the speed v of the charge carriers, as a function of the electrical field, is given by the graph of FIG. 2. It shows a maximum value for a so-called critical field $E_c$, to which there corresponds a peak speed $v_{pic}$, and a minimum value in the valley, at $v_{sat}$.

If a Gunn triode is biased by a voltage such that no point of the bar in the anode-cathode space is subjected to a field higher than the critical field $E_c$, a negative pulse (FIG. 1) at the gate creates a space charge, beneath the gate, such that the critical field $E_c$ is reached: the conditions of a nucleation are met. A domain 2, under a high field, is created beneath the edge of the gate G on the anode A side. It grows and is propagated towards the anode at a speed close to the limit speed of the electrons, namely, $10^7 cm/sec^{-1}$ in GaAs. Having reached the anode, the domain is extinguished and the bar 1 resumes its initial state with the transfer of electrons in the form of bunches called domains.

This phenomenon is due to a negative differential mobility caused by the transfer, which is dependent on the field, of the electrons of the conduction band from a low-energy, high-mobility valley to a high-energy, low-mobility valley. In these conditions, an excess space charge on the cathode side is displaced towards the anode and grows exponentially as a consequence of the negative differential mobility.

When the growth rate is high enough, ($n_o L_{AG} > 10^{12}$ cm$^{-2}$ for GaAs), a domain under a high field is formed and the field outside the domain falls to a value below that of the critical field $E_c$.

It has been established that for a domain to exist and to be propagated it must be subjected to a field at least equal to $E_c/2$.

The propagation of a domain is shown in FIG. 3 where the time is indicated on the x axis and the voltage $V_{GK}$ applied to the gate G (top graph) and the current $I_{AK}$ in the Gunn device (bottom graph) are indicated on the y axis.

With a Gunn triode being biased between the anode and the cathode, if a negative pulse 3 is applied to the gate, a domain is created with a slight lag in time. During its propagation towards the anode, the current $I_{AK}$ flowing through the triode drops for a time T equal to the transfer time of the domain from the gate G to the anode A. The result of this is a dip 4. The duration of the dip 4 is equal to:

$$T = \frac{L_{GA}}{v_{sat}}$$

$v_{sat}$ being the limit speed of the electrons in the material considered.

As soon as the domain has reached the anode, the current rises again to the original value of the bias current $I_{AK}$ at 5 but, during the transit time of a domain, there cannot be any nucleation of a new domain.

The graph of FIG. 3 corresponds to a case where the field in the bar is below the critical field $E_c$, except during the pulse, beneath the gate.

If, on the contrary, the bias conditions $V_{AK}$ and $V_{GK}$ are such that the field beneath the gate is permanently above $E_c$ there is permanent, cyclical nucleation of a domain, the propagation of this domain towards the anode and its extinction: the functioning mode is asynchronous. The structure oscillates freely at a frequency corresponding to the propagation time of the domains in the gate-cathode space, depending on the profile of the field in the bar. The Gunn triode then constitutes an asynchronous oscillator for which the diagram of the current in time is given by FIG. 4.

An increase in $V_{AK}$ causes a field variation in the device which very slightly modifies the saturation speed of the domains under high field in transit in the gate-anode space, causing a slight variation in the free oscillation frequency of the structure. But, in this case, the frequency variation never exceeds 1% to 2% of the nominal frequency given by the geometrical dimension $L_{GK}$ of the rectangular bar.

All the above description relates to a Gunn device for which the bar has a uniform section between the anode and the cathode. Devices with a non-uniform section, for example a trapezoidal section, have been described by M. Shoji in *Proceedings of the IEEE*, January 1967, pp. 130–131, and May 1967, pp. 720–721 as well as in IEEE, *Transactions on Electron Devices*, Vol. ED. 11, No. 9, September 1967, pp. 535–546.

The geometry of a device of this type, seen in a plane view, is given in FIG. 5. This device is a triode with its bar 1, made of semi-conducting material, having a trapezoidal section in which the anode A forms the large base while the gate G forms the small base. The anode, the cathode and the gate are subjected to a bias as in FIG. 1. In this structure, a closer dependence of the frequency on the bias voltage is observed because the non-uniform section introduces an electrical field gradient between the gate and the anode.

Let x be the distance measured from the gate in the direction of the anode, and consider FIG. 6 which gives the variation of the electrical field in the bar as a function of the distance x. For a trapezoidal triode, the curve is a hyperbola.

For a first bias value $V_{AK1}$, with the gate being biased by a DC voltage, a domain comes into existence beneath the gate because the field is at least equal to the critical field $E_c$, and it is propagated up to a point where the field is no longer anything but $E_c/2$ to which there corresponds a distance $x_1$ and a frequency $F_1$: there it is extinguished.

For a second value $V_{AK2}$, greater than $V_{AK1}$ for example, a domain is propagated up to a distance $x_2$ greater than $x_1$, and then it is extinguished. The setting precision of this type of VCO, which has a trapezoidal bar is far greater than that of a VCO with a rectangular bar, because the frequency is related to the distance x travelled by a domain before it is extinguished. However, there is a slight lack of precision as regards the stability of the frequency, for a domain which is propagated gets extinguished when it is no longer subjected to any field but a field $\frac{1}{2}E_c \mp E$ shown in FIG. 6 by a segment 6. Depending on whether the domain is extinguished at $+E$ or at $-E$ with respect to $\frac{1}{2}E_c$, it has travelled a distance which is slightly longer or slightly shorter than $x_1$ represented by a segment 7. Since the frequency is related to the distance x, this frequency is slightly unstable.

This type of VCO is however highly agile and its frequency variation can be controlled on a single period. The current given by a Gunn oscillator with a trapezoidal geometry is saw-toothed as is shown in FIG. 7.

In prior art Gunn oscillators the bias voltage applied to the gate is direct, or it is applied by negative pulses.

According to the present invention, an AC voltage $V_{HF}$ is superimposed on the biasing DC voltage of the gate or anode, the frequency of the AC voltage corresponding to the free oscillation frequency of a Gunn device having a non-uniform section between the anode and the cathode.

The first effect of this superimposition of tw biasing voltages is shown in FIG. 8 which gives the electrical field E as a function of the distance x. On a direct voltage, represented by the graph 8, there is superimposed an AC voltage $V_{HF}$, the maximum $V_{G1}$ of which follows the curve 9 and the minimum $V_{G2}$ of which follows the curve 10. Since there is a superimposition of two electrical voltages, the field $\frac{1}{2}E_c$ oscillates between two values marked 11 and 12 following the oscillations of the AC voltage $V_{HF}$. A domain which is propagated could therefore be extinguished at a point located between a distance $x_{11}$ and a distance $x_{12}$. In fact, theory and experience show that a domain is extinguished when the AC voltage starts decreasing, at a point such as 13, and does so very evenly.

An alternating external wave, superimposed on the bias voltage, thus makes it possible to re-synchronize the frequency given by the Gunn triode, and the output wave is very pure and very stable.

Furthermore, if the AC voltage $V_{HF}$ is no longer equal to the free oscillation frequency of the Gunn device but has the form $f + \Delta f$, the oscillator is required to function at a frequency which is no longer its free oscillation frequency, and this re-synchronization is again observed in a frequency range of the order of 5% to 10% of the control frequency. Thus, a frequency vernier device is achieved and, if the Gunn triode oscillates freely, for example at 10 GHz, it is possible to control its output frequency between 9 and 11 GHz, with a very pure spectrum, due to the superimposition of a AC voltage on the DC bias voltage.

If, according to the present invention, an AC voltage is superimposed on the DC bias voltage, the frequency of this AC voltage being a harmonic of the free oscillation frequency of the Gunn device, a frequency divider is made. FIG. 9, in conjunction with FIG. 8, enables an understanding of the mechanism of this device.

FIG. 9 shows a plane view of a Gunn triode according to the present invention, the anode/gate section of which is trapezoidal. The gate is DC biased, positively with respect to the cathode, and an AC voltage $V_{HF}$ with a harmonic frequency is superimposed on the voltage $V_{GK}$. To simplify the description, let the control voltage $V_{HF}$ be the third harmonic of the free oscillation frequency.

When a domain is propagated from the gate, at the first period of the control voltage, the domain is at a position $x_1$: it is subjected to a field between $E_c$ and $\frac{1}{2}E_c$ and it is not extinguished during the decreasing half-period of $V_{HF}$ since it is still in the conditions for its existence.

At the second period, the domain is at a position $x_2$ and, for the same reasons, it still exists.

At the third period, the domain reaches a position $x_3$ and, since it is henceforth subjected only to a field smaller than or equal to $\frac{1}{2}E_c$, it becomes extinguished in accordance with the description made with reference to FIG. 8. The Gunn triode according to the invention has therefore performed a division by three of the input frequency which is the control frequency.

More generally, if the control frequency is an N order harmonic of the free oscillation frequency of the Gunn triode, this triode performs an N order division.

If the control voltage is itself at a frequency $f + \Delta f$ slightly different from the free oscillation frequency, it imposes a re-synchronization on the Gunn device which is identical to the one described previously. In a frequency range depending on the order of the harmonic ($\Delta f = 5\%$ to 10% of the frequency) it is therefore possible to regulate the output frequency of the Gunn device with precision. Thus, a vernier device has been made for a dynamic frequency divider.

In short, for the programmable divider according to the present invention, there are three means to control the output frequency:

in making the bias voltage $V_{AK}$ vary, an output frequency of a fixed order is obtained, according to the curve of FIG. 10 which corresponds to the prior art;

in applying to the gate a voltage with a harmonic frequency of the free oscillation frequency, a variable order frequency divider is obtained;

in further applying, to the gate, a voltage with a frequency, which differs from a harmonic of the free oscillation frequency by a $\Delta f$, a frequency divider with a vernier scale is obtained.

However, it is a disadvantage, if we consider the response curve of FIG. 10, for an oscillator or a frequency divider to have a frequency response which is not linear with the bias voltage $V_{AK}$. It is known that this response curve, in FIG. 10, as also the electrical field curves in FIGS. 6 and 8, are hyperbolas. However, it is more practical for users to have equipment which has a response that is linear with the command.

The invention provides a solution to this problem with the Gunn device of FIG. 11. This is a Gunn triode wherein its GaAs or InP layer, located between the anode and the gate, is demarcated laterally by two edges 14 and 15 which have a hyperbola shape. Thus the field gradient existing in the Gunn triode shows a linear variation which gives the Gunn device a linear response curve according to FIG. 12.

It is easy to make a Gunn triode according to the present invention. A layer, one to two microns thick, of III-V material such as GaAs or InP, with n type doping to $5 \times 10^{14} - 5 \times 10^{15}$ at/cm$^{-3}$ is deposited by implantation on an insulating or semi-insulating layer which is advantageously made of semi-conducting material. The three metallizations, namely the anode, cathode and gate metallizations, are deposited according to the usual techniques in planar technology. Measured along the anode-cathode axis, the anode is five microns long, the trapezoidal or hyperbolic region measures 20 microns, the gate one micron, the gate-cathode space two microns and the cathode five microns, making a total of 33 microns. The applied voltages range from 5 to 15 V and the device oscillates or divides from about 1 GHz to 60 GHz.

An application of this triode is given in FIG. 13 which shows a frequency synthesizing loop. Let 15 be an oscillator for which it is sought to automatically control the output frequency F ranging from 10 to 60 GHz. It excites a programmable dynamic frequency divider 16, according to the present invention, which gives an output frequency which is very precise and very pure but still too high (a few gigahertz) to be able to automatically control the oscillator. A second frequency divider 17 made of silicon or GaAs again divides this frequency and addresses it to a phase comparator 18 which is simultaneously excited by a signal given by a reference frequency source 19 which automatically controls the voltage controlled oscillator 15 with precision. The Gunn device is then included in the phase locking loop formed by the elements 16, 17, 18 and 19.

The planar embodiment of the Gunn triode according to the present invention enables its integration in integrated circuits and thus enables the making, for example, of the oscillator unit 15 and its synthesizing loop 16 +17, monolithically on one and the same chip.

What is claimed is:

1. A Gunn effect triode device operable at very high frequencies of 1 to 60 GHZ comprising:
    a substrate of substantially semi-insulating material;
    a layer of group III–V semiconducting material having first and second ends;
    an anode metallization provided at a first end of said layer;
    a cathode metallization provided at the second end of said layer;
    a gate metallization provided between said anode and cathode metallization;
    wherein said device has a free oscillation frequency when it is biased by a first DC voltage, $V_{AK}$, between the anode and cathode metallizations and a second DC voltage, $V_{GK}$, between the gate and cathode metallizations;
    wherein the layer of semiconducting material between the anode and gate metallizations has a non-uniform width, said anode metallization being wider than said gate metallization;
    wherein the gate or anode metallization is biased by an AC control voltage, $V_{HF}$, superimposed on the DC voltages $V_{AK}$ and $V_{GK}$, said AC voltage having a frequency which is a harmonic of the free oscillation frequency of the Gunn effect triode.

2. A Gunn triode device according to claim 1 wherein the layer of semi-conducting material, between the anode and the cathode, has a trapezoidal geometry, the large base of which is formed by the anode metallization and the small base of which is formed by the gate metallization.

3. A Gunn triode device according to claim 1 wherein the layer of semi-conducting material between the anode metallization and the gate metallization is limited laterally by two edges having a hyperbolic shape, and has a curved trapezoidal shape, the large base of which is formed by the anode and the small base of which is formed by the gate.

4. A Gunn triode device according to claim 1 wherein a variation, $\Delta f$, of the frequency, $f \pm \Delta f$, of the control voltage, $V_{HF}$, enables the adjusting of the output frequency by re-synchronization and constitutes a frequency vernier device.

5. A Gunn triode device according to claim 4 constituting a dynamic divider of the free oscillation frequency, said frequency divider being:
    of a variable order, depending on the whole number harmonic order of the control frequency, $V_{HF}$,
    programmable depending on the variation, $\Delta f$, of this control frequency, $f + \Delta f$, with respect to the whole number harmonic.

6. A Gunn triode device according to claim 1 constituting a dynamic divider of the frequency $V_{HF}$ applied to its gate or to anode metallization, the fixed order of division being controlled by the anode-cathode metallization DC bias voltage, $V_{AK}$.

7. A Gunn triode device according to claim 1 constituting a voltage controlled oscillator, the output frequency of which is programmable by an AC voltage, $V_{HF}$.

8. A Gunn triode device according to claim 3 wherein its frequency response is linear with respect to its anode-cathode bias voltage, $V_{AK}$.

9. A Gunn triode device according to any of the preceding claims wherein it is integrated in the chip of an integrated circuit made of III–V group material.

10. A Gunn effect triode device operable at very high frequencies of 1 to 60 GHZ comprising:
    a substrate of substantially semi-insulating material;
    a layer of group III–V semiconducting material having first and second ends;
    an anode metallization provided at a first end of said layer;
    a cathode metallization produced at the send end of said layer;
    a gate metallization provided between said anode and cathode metallizations;
    wherein said device has a free oscillation frequency when it is biased by a first DC voltage, $V_{AK}$, between the anode and cathode metallizations and a second DC voltage, $V_{GK}$, between the gate and cathode metallizations;
    wherein the layer of semiconducting material between the anode and gate metallizations has a curved trapezoidal shape having a large and small base, said anode metallization forming said large base and said gate metallization forming said small base;
    wherein said trapezoidal shaped layer is limited laterally by two edges having a hyperbolic shape.

11. A Gunn effect triode device according to claim 10, wherein the gate or anode metallization is biased by an AC control voltage, $V_{HF}$, superimposed on the DC voltage, $V_{AK}$ or $V_{GK}$, said AC voltage having a frequency which is a harmonic of the free oscillation frequency of the Gunn effect triode.

12. A Gunn effect triode device according to claim 11 further comprising:
    a dynamic divider of the frequency $V_{HF}$ applied to the gate or to anode metallization, the fixed order of division being controlled by the anode-cathode metallization DC bias voltage, $V_{AK}$.

13. A Gunn effect triode device according to claim 11 wherein its frequency response is linear with respect to its anode-cathode metallization bias voltage, $V_{AK}$.

* * * * *